(12) United States Patent
Manku et al.

(10) Patent No.: US 6,973,297 B1
(45) Date of Patent: Dec. 6, 2005

(54) METHOD AND APPARATUS FOR DOWN-CONVERSION OF RADIO FREQUENCY (RF) SIGNALS WITH REDUCED LOCAL OSCILLATOR LEAKAGE

(75) Inventors: Tajinder Manku, Waterloo (CA); Lawrence Wong, Markham (CA); Yang Ling, Kitchener (CA)

(73) Assignee: Sirific Wireless Corporation, (CA)

( * ) Notice: Subject to any disclaimer, the term of this patent is extended or adjusted under 35 U.S.C. 154(b) by 236 days.

(21) Appl. No.: 10/070,012

(22) PCT Filed: Sep. 1, 2000

(86) PCT No.: PCT/CA00/00994

§ 371 (c)(1), (2), (4) Date: Jul. 29, 2002

(87) PCT Pub. No.: WO01/17120

PCT Pub. Date: Mar. 8, 2001

(30) Foreign Application Priority Data

Sep. 1, 1999 (CA) .................................... 2281236

(51) Int. Cl.[7] .................................................. H04B 1/26

(52) U.S. Cl. ...................... 455/323; 455/315; 455/318; 455/324; 375/346

(58) Field of Search ................................ 455/313, 314, 455/318, 319, 323, 324, 326, 333, 310, 315; 375/346

(56) References Cited

U.S. PATENT DOCUMENTS 4,110,834 A 8/1978 Altwein
4,193,034 A 3/1980 Vance
4,238,850 A 12/1980 Vance
4,254,503 A 3/1981 Vance
4,271,501 A 6/1981 Vance et al.
4,322,851 A 3/1982 Vance
4,462,107 A 7/1984 Vance
4,470,147 A 9/1984 Goatcher
4,476,585 A 10/1984 Reed
4,480,327 A 10/1984 Vance
4,488,064 A 12/1984 Vance
4,506,262 A 3/1985 Vance et al.
4,521,892 A 6/1985 Vance et al.
4,523,324 A 6/1985 Marshall
4,525,835 A 6/1985 Vance et al.

(Continued)

FOREIGN PATENT DOCUMENTS

CA 1226627 9/1987

(Continued)

OTHER PUBLICATIONS

Aue et al. "Multicarrier spread spectrum modulation with reduce dynamic range," IEEE Vehicular Technology Conference Atlanta, vol. 2, pp. 914-917 (1996).

(Continued)

*Primary Examiner*—Nguyen T. Vo
*Assistant Examiner*—Blane J. Jackson
(74) *Attorney, Agent, or Firm*—Townsend and Townsend and Crew LLP

(57) ABSTRACT

This patent describes a method of removing the LO-leakage and 1/f noise problems associated with direct conversion RF receivers and other demodulators. In order to solve this problem a virtual LO™ signal is generated within the RF signal path which is tuned to the incoming RF signal. The virtual local oscillator (VLO) signal is constructed using signals that do not contain a significant amount of power (or no power at all) at the LO frequency. Any errors in generating the virtual LO signal are minimized using a closed loop correction scheme.

24 Claims, 8 Drawing Sheets

U.S. PATENT DOCUMENTS

| | | | | | |
|---|---|---|---|---|---|
| 4,571,738 | A | | 2/1986 | Vance | |
| 4,583,239 | A | | 4/1986 | Vance | |
| 4,599,743 | A | | 7/1986 | Reed | |
| 4,618,967 | A | | 10/1986 | Vance et al. | |
| 4,677,690 | A | | 6/1987 | Reed | |
| 4,726,042 | A | | 2/1988 | Vance | |
| 4,736,390 | A | * | 4/1988 | Ward et al. | 375/316 |
| 4,811,425 | A | | 3/1989 | Feerst | |
| 4,955,039 | A | | 9/1990 | Rother et al. | |
| 5,128,623 | A | | 7/1992 | Gilmore | |
| 5,179,728 | A | | 1/1993 | Sowadski | |
| 5,220,688 | A | | 6/1993 | Tao | |
| 5,228,042 | A | | 7/1993 | Gauthier et al. | |
| 5,303,417 | A | | 4/1994 | Laws | |
| 5,361,408 | A | | 11/1994 | Watanabe et al. | |
| 5,390,346 | A | | 2/1995 | Marz | |
| 5,416,803 | A | | 5/1995 | Janer | |
| 5,422,889 | A | * | 6/1995 | Sevenhans et al. | 370/442 |
| 5,448,772 | A | * | 9/1995 | Grandfield | 455/333 |
| 5,451,899 | A | | 9/1995 | Lawton | |
| 5,467,294 | A | | 11/1995 | Hu et al. | |
| 5,471,665 | A | * | 11/1995 | Pace et al. | 455/343.2 |
| 5,530,929 | A | | 6/1996 | Lindqvist et al. | |
| 5,715,530 | A | | 2/1998 | Eul | |
| 5,838,717 | A | | 11/1998 | Ishii et al. | |
| 5,918,167 | A | | 6/1999 | Tiller et al. | |
| 5,918,169 | A | | 6/1999 | Dent | |
| 5,949,830 | A | | 9/1999 | Nakanishi | |
| 5,953,643 | A | | 9/1999 | Speake et al. | |
| 6,002,923 | A | | 12/1999 | Sahlman | |
| 6,014,408 | A | | 1/2000 | Naruse et al. | |
| 6,029,058 | A | | 2/2000 | Namgoog et al. | |
| 6,049,706 | A | | 4/2000 | Cook et al. | |
| 6,061,551 | A | | 5/2000 | Sorrells et al. | |
| 6,073,000 | A | | 6/2000 | Shinohara | |
| 6,091,940 | A | | 7/2000 | Sorrels et al. | |
| 6,125,272 | A | | 9/2000 | Bautista | |
| 6,148,184 | A | | 11/2000 | Manku et al. | |
| 6,167,247 | A | | 12/2000 | Kannel et al. | |
| 6,194,947 | B1 | | 2/2001 | Lee et al. | |
| 6,243,569 | B1 | | 6/2001 | Atkinson | |
| 6,308,058 | B1 | | 10/2001 | Souetinov et al. | |
| 6,324,388 | B1 | | 11/2001 | Souetinov | |
| 2001/0014596 | A1 | | 8/2001 | Takaki et al. | |

FOREIGN PATENT DOCUMENTS

| | | | |
|---|---|---|---|
| CA | 1290403 | | 10/1991 |
| CA | 2243757 | A1 | 2/1999 |
| CA | 2245958 | | 2/1999 |
| CA | 2305134 | A1 | 4/1999 |
| CA | 2224953 | | 6/1999 |
| CA | 2316969 | A1 | 7/1999 |
| CA | 2270337 | | 10/1999 |
| CA | 2272877 | | 11/1999 |
| CA | 2281236 | A1 | 3/2001 |
| CA | 2339744 | A1 | 3/2001 |
| CA | 2331228 | A1 | 7/2001 |
| CA | 2300045 | A1 | 9/2001 |
| CA | 2273671 | | 3/2002 |
| EP | 0634855 | A1 | 1/1995 |
| EP | 0721270 | A1 | 7/1996 |
| EP | 0782249 | A1 | 7/1997 |
| EP | 837565 | A | 4/1998 |
| EP | 0899868 | A | 3/1999 |
| EP | 902549 | A | 3/1999 |
| EP | 1085665 | A2 | 3/1999 |
| EP | 977351 | A | 2/2000 |
| EP | 0993125 | A2 | 4/2000 |
| EP | 1067689 | A2 | 1/2001 |
| EP | 1085652 | A2 | 3/2001 |
| GB | 2329085 | A | 3/1999 |
| GB | 2331207 | A | 5/1999 |
| WO | WO 96/01006 | A | 1/1996 |
| WO | WO 96/01006 | A1 | 1/1996 |
| WO | WO 97/50202 | A2 | 12/1997 |
| WO | WO 99/55000 | A2 | 10/1999 |
| WO | WO 99/55015 | A1 | 10/1999 |
| WO | WO 00/05815 | A1 | 2/2000 |
| WO | WO 00/69085 | A1 | 11/2000 |

OTHER PUBLICATIONS

Abidi "Direct-Conversion Radio Transceivers for Digital Communications," IEEE J. of Solid-State Circuits, 30:1399-1410 (1995).

Anvari et al. "Performance of a Direct Conversion Receiver with π/4-DPSK Modulated Signal," IEEE publication CH2944-7/91/0000/0822, pp. 822-827 (1991).

Cho et al. "A Single Chip CMOS Direct-Conversion Transceiver For 900MHz Spread-Spectrum Digital Cordless Phones," IEEE 1999 International Solid-State Circuits Conference paper TP13.5 (1999).

Enz "Design of Low-Power and Low-Voltage Analog and RF Integrated Circuits in Ultra Deep Submicron CMOS Technologies," available from the Electronics Laboratory of EPFL (Lausanne) website http://legwww.epfl.ch (2001).

GCT Semiconductor, Inc. "GCT's Direct Conversion Technology," product information available from http://www.gct21.com (2002).

Heinen et al. "A 2.7V 2.5GHz Bipolar Chipset for Digital Wireless Communication," IEEE 1997 International Solid-State Circuits Conference, paper SA 18.4 (1997).

Marshall et al. A 2.7GHz GSM Transceiver ICs with On-Chip Filtering, IEEE 1995 International Solid-State Circuits Conference, paper TA 8.7 (1995).

McDonald "A 2.5GHz BiCMOS Image-Reject Front-End," 1993 International Solid-State Circuits Conference, paper TP 9.4 (1993).

Razavi "Design Considerations for Direct-Conversion Receivers," IEEE Transactions on Circuits and Systems—II: Analog and Digital Signal Prcessing 44:428-435 (1997).

Rudell et al. "A 1.9GHz Wide-Band IF Double Conversion CMOS Integrated Receiver for Cordless Telephone Applications," IEEE 1997 International Solid-State Circuits Conference, paper SA 18.3 (1997).

Sanduleanu et al. "Chopping: a technique for noise and offset reduction," *Power, Accuracy and Noise Aspects in CMOS Mixed-Signal Design*, chapter 5, sections 5.2 and 5.4, EDA Books Online http://www.dacafe.com (1999).

Sanduleanu et al. "Low-Power Low-Voltage Chopped Transconductance Amplifier for Noise and Offset Reduction," conference paper, 23rd European Solid-State Circuits Conference Southampton, UK, Sep. 16-18, 1997.

Sevenhans et al. "An integrated Si bipolar RF transceiver for zero if 900 MHz GSM digital mobile radio frontend of a hand portable phone," Proceedings of the Custom ICConference, San Diego 1991; IEEE publication 0-7803-0768-2, pp561-564 (1992).

Stetzler et al. "A 2.7V to 4.5 V Single-Chip GSM Transceiver RF Integrated Circuit," 1995 International Solid-State Circuits Conference, paper TA 8.8 (1995).

* cited by examiner

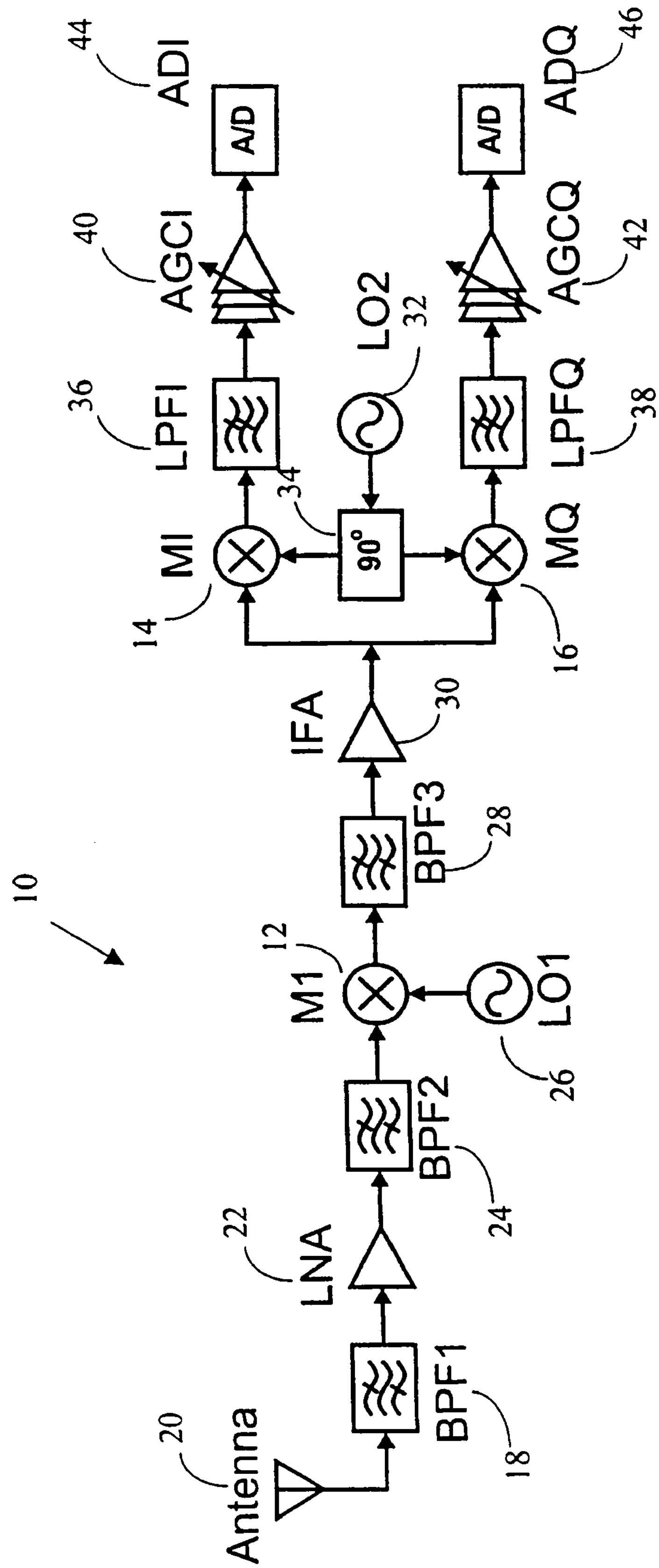
FIGURE 1 - PRIOR ART

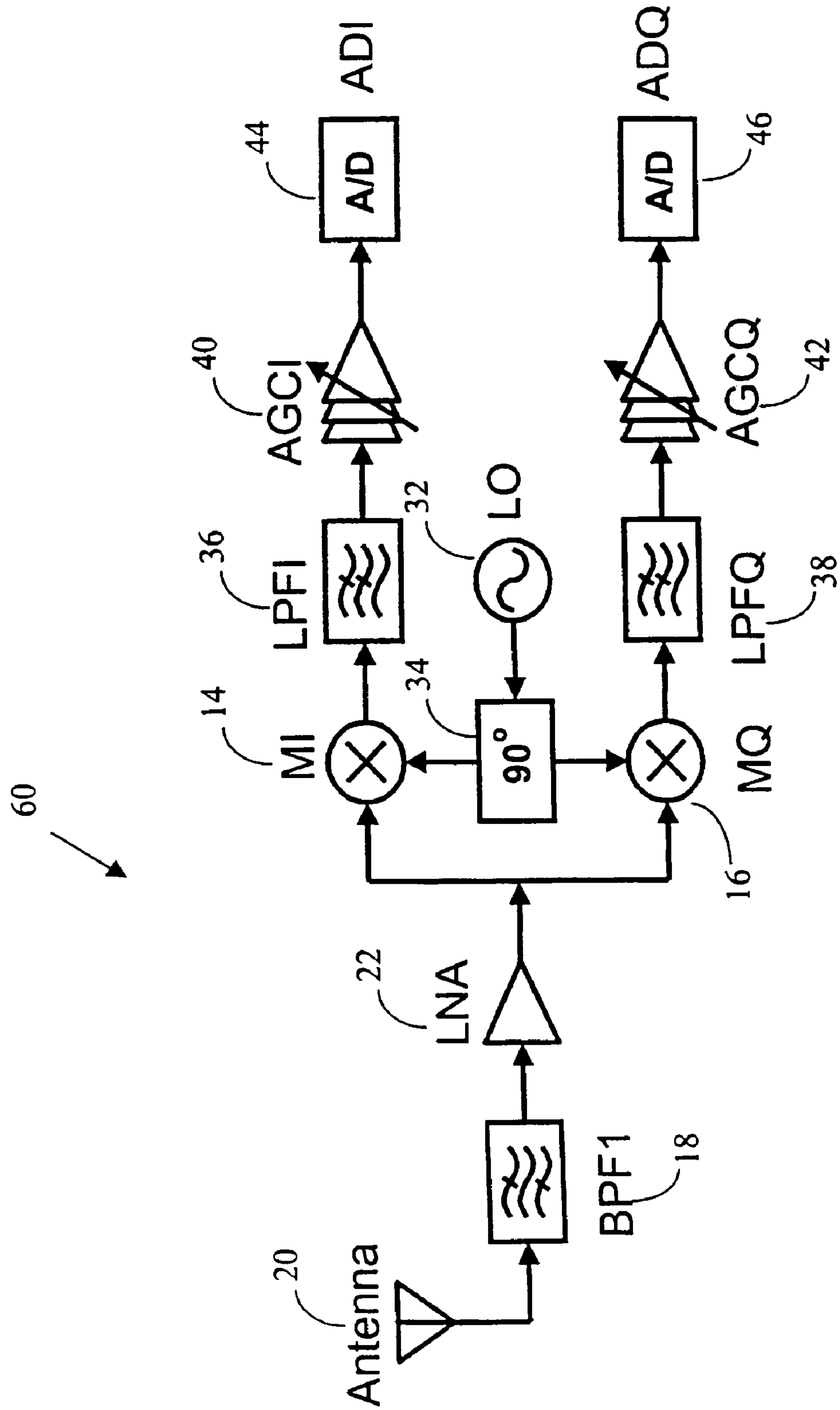
FIGURE 2 - PRIOR ART

METHOD AND APPARATUS FOR DOWN-CONVERSION OF RADIO FREQUENCY (RF) SIGNALS WITH REDUCED LOCAL OSCILLATOR LEAKAGE

The present invention relates generally to communications, and more specifically, to a fully-integrable method and apparatus for down conversion of radio frequency (RF) signals with reduced local oscillator (LO) leakage and 1/f noise.

BACKGROUND OF THE INVENTION

Many communication systems modulate electromagnetic signals to higher frequencies for transmission, and subsequently demodulate those high frequencies back to their original frequency band when they reach the receiver. The original (or baseband) signal, may be, for example: data, voice or video. These baseband signals may be produced by transducers such as microphones or video cameras, be computer generated, or transferred from an electronic storage device.

All of these signals are generally referred to as radio frequency (RF) signals, which are electromagnetic signals, that is, waveforms with electrical and magnetic properties within the electromagnetic spectrum normally associated with radio wave propagation. The electromagnetic spectrum was traditionally divided into 26 alphabetically designated bands, however, the ITU formally recognizes 12 bands, from 30 Hz to 3000 GHz. New bands, from 3 THz to 3000 THz, are under active consideration for recognition.

Wired communication systems which employ such modulation and demodulation techniques include computer communication systems such as local area networks (LANs), point to point signalling, and wide area networks (WANs) such as the Internet. These networks generally communication data signals over electrical or optical fibre chanels. Wireless communication systems which may employ modulation and demodulation include those for public broadcasting such as AM and FM radio, and UHF and VHF television. Private communication systems may include cellular telephone networks, personal paging devices, HF radio systems used by taxi services, microwave backbone networks, interconnected appliances under the Bluetooth standard, and satellite communications. Other wired and wireless systems which use RF modulation and demodulation would be known to those skilled in the art.

One of the current problems in the art, is to develop physically small and inexpensive modulation and demodulation techniques and devices that have good performance characteristics. For cellular telephones, for example, it is desirable to have a receiver which can be fully integrated onto an integrated circuit.

Several attempts have been made at completely integrating communication receiver designs, but have met with limited degrees of success. Most RF receivers use the "super-heterodyne" topology, which provides good performance, but does not meet the desired level of integration for modern wireless systems. The super-heterodyne topology typically requires at least two high quality filters that cannot be economically integrated within any modern IC technology. Other RF receiver topologies exist, such as image rejection architectures, which can be completely integrated on a chip but lack in overall performance.

Existing solutions and their associated problems and limitations are summarized below:

1. Super-heterodyne:

The super-heterodyne receiver uses a two-step frequency translation method to convert an RF signal to a baseband signal. FIG. 1 presents a block diagram of a typical super-heterodyne receiver 10. The mixers labelled MI 12, MI 14, and MQ 16 are used to translate the RF signal to baseband or to some intermediate frequency (IF). The balance of the components amplify the signal being processed and filter noise from it.

The RF band pass filter (BPF1) 18 first filters the signal coming from the antenna 20 (note that this band pass filter 18 may also be a duplexer). A low noise amplifier 22 then amplifies the filtered antenna signal, increasing the strength of the RF signal and reducing the noise figure of the receiver 10. The signal is next filtered by another band pass filter (BPF2) 24 usually identified as an image rejection filter. The signal then enters mixer MI 12 which multiplies the signal from the image rejection filter 24 with a periodic signal generated by the local oscillator (LO1) 26. The mixer MI 12 receives the signal from the image rejection filter 24 and translates it to a lower frequency, known as the first intermediate frequency (IF1).

Generally, a mixer is a circuit or device that accepts as its input two different frequencies and presents at its output:

(a) a signal equal in frequency to the sum of the frequencies of the input signals;

(b) a signal equal in frequency to the difference between the frequencies of the input signals; and (c) the original input frequencies.

The typical embodiment of a mixer is a digital switch which may have significantly more tones than stated above.

The IF1 signal is next filtered by a band pass filter (BPF3) 28 typically called the channel filter, which is centred around the IF1 frequency, thus filtering out mixer signals (a) and (c) above.

The signal is then amplified by an amplifier (IFA) 30, and is split into its in-phase (I) and quadrature (Q) components, using mixers MI 14 and MQ 16, and orthogonal signals generated by local oscillator (LO2) 32 and 90 degree phase shifter 34. LO2 32 generates a periodic signal which is typically tuned the IF1 frequency. The signals coming from the outputs of MI 14 and MQ 16 are now at baseband, that is, the frequency at which they were originally generated. The two signals are next filtered using low pass filters LPFI 36 and LPFQ 38 to remove the unwanted products of the mixing process, producing baseband I and Q signals. The signals may then be amplified by gain-controlled amplifiers AGCI 40 and AGCQ 42, and digitized via analog to digital converters ADI 44 and ADQ 46 if required by the receiver.

The main problems with the super-heterodyne design are:

it requires expensive off-chip components, particularly band pass filters 18, 24, 28, and low pass filters 36, 38;

the off-chip components require design trade-offs that increase power consumption and reduce system gain;

image rejection is limited by the off-chip components, not by the target integration technology;

isolation from digital noise can be a problem; and it is not fully integratable.

2. Direct Conversion:

Direct conversion architectures demodulate RF signals to baseband in a single step, by mixing the RF signal with a local oscillator signal at the carrier frequency. There is therefore no image frequency, and no image components to corrupt the signal. Direct conversion receivers offer a high level of integratability, but also have several important problems. Hence, direct conversion receivers have thus far proved useful only for signalling formats that do not place appreciable signal energy near DC after conversion to baseband.

A typical direct conversion receiver is shown in FIG. 2. The RF band pass filter (BPF1) 18 first filters the signal coming from the antenna 20 (this band pass filter 18 may also be a duplexer). A low noise amplifier 22 is then used to amplify the filtered antenna signal, increasing the strength of the RF signal and reducing the noise figure of the receiver 10.

The signal is then split into its quadrature components using mixers MI 14 and MQ 16, and orthogonal signals generated by local oscillator (LO2) 32 and 90 degree phase shifter 34. LO2 32 generates a periodic signal which is tuned the incoming wanted frequency rather than an IF frequency as in the case of the super-heterodyne receiver. The signals coming from the outputs of MI 14 and MQ 16 are now at baseband, that is, the frequency at which they were originally generated. The two signals are next filtered using low pass filters LPFI 36 and LPFQ 38, are amplified by gain-controlled amplifiers AGCI 40 and AGCQ 42, and are digitized via analog to digital converters ADI 44 and ADQ 46.

Direct conversion RF receivers have several advantages over super-heterodyne systems in term of cost, power, and level of integration, however, there are also several serious problems with direct conversion. These problems include:

- noise near baseband (that is, 1/f noise) which corrupts the desired signal;
- local oscillator (LO) leakage in the RF path that creates DC offsets. As the LO frequency is the same as the incoming signal being demodulated, any leakage of the LO signal onto the antenna side of the mixer will pass through to the output side as well;
- local oscillator leakage into the RF path that causes desensitization. Desensitation is the reduction of desired signal gain as a result of receiver reaction to an undesired signal. The gain reduction is generally due to overload of some portion of the receiver, such as the AGC circuitry, resulting in suppression of the desired signal because the receiver will no longer respond linearly to incremental changes in input voltage.
- noise inherent to mixed-signal integrated circuits corrupts the desired signal;
- large on-chip capacitors are required to remove unwanted noise and signal energy near DC, which makes integrability expensive. These capacitors are typically placed between the mixers and the low pass filters; and
- errors are generated in the quadrature signals due to inaccuracies in the 90 degree phase shifter.

3. Image Rejection Architectures:

Several image rejection architectures exist, the two most well known being the Hartley Image Rejection Architecture and the Weaver Image Rejection Architecture. There are other designs, but they are generally based on these two architectures while some methods employ poly-phase filters to cancel image components. Generally, either accurate signal phase shifts or accurate generation of quadrature local oscillators are employed in these architectures to cancel the image frequencies. The amount of image cancellation is directly dependent upon the degree of accuracy in producing the phase shift or in producing the quadrature local oscillator signals.

Although the integratability of these architectures is high, their performance is relatively poor due to the required accuracy of the phase shifts and quadrature oscillators. This architecture has been used for dual mode receivers on a single chip.

4. Near Zero-IF Conversion:

This receiver architecture is similar to the direct conversion architecture, in that the RF band is brought close to baseband in a single step. However, the desired signal is not brought exactly to baseband and therefore DC offsets and 1/f noise do not contaminate the signal. Image frequencies are again a problem as in the super-heterodyne structure.

Additional problems encountered with near zero-IF architectures include:

- the need for very accurate quadrature local oscillators; and
- the need for several balanced signal paths for purposes of image cancellation.

5. Sub-sampling Downconversion:

This method of signal downconversion utilizes subsampling of the RF signal to cause the frequency translation. Although the level of integration possible with this technique is the highest among those discussed thus far, the subsampling downconversion method suffers from two major drawbacks:

- subsampling of the RF signal causes aliasing of unwanted noise power to DC. Sampling by a factor of m increases the downconverted noise power of the sampling circuit by a factor of 2m; and
- subsampling also increases the effect of noise in the sampling clock. In fact, the clock phase noise power is increased by $m^2$ for sampling by a factor of m.

There is therefore a need for a method and apparatus of demodulating RF signals which allows the desired integrability along with good performance.

SUMMARY OF THE INVENTION

It is therefore an object of the invention to provide a novel method and system of modulation which obviates or mitigates at least one of the disadvantages of the prior art.

One aspect of the invention is broadly defined as a radio frequency (RF) down-convertor with reduced local oscillator leakage, for demodulating an input signal x(t), comprising: a synthesizer for generating time-varying signals $\phi_1$ and $\phi_2$, where $\phi_1 * \phi_2$ has significant power at the frequency of a local oscillator signal being emulated, and neither $\phi_1$ nor $\phi_2$ has significant power at the frequency of the local oscillator signal being emulated; a first mixer coupled to the synthesizer for mixing the input signal x(t) with the time-varying signal $\phi_1$ to generate an output signal x(t) $\phi_1$; and a second mixer coupled to the synthesizer and to the output of the first mixer for mixing the signal x(t) $\phi_1$ with the time-varying signal $\phi_2$ to generate an output signal x(t) $\phi_1$ $\phi_2$.

BRIEF DESCRIPTION OF THE DRAWINGS

These and other features of the invention will become more apparent from the following description in which reference is made to the appended drawings in which:

FIG. 1 presents a block diagram of a super-heterodyne system as known in the art;

FIG. 2 presents a block diagram of a direct conversion or homodyne system as known in the art;

FIG. 3(*b*) presents exemplary mixer input signals functions $\phi_1$ and $\phi_2$ plotted in amplitude against time;

DETAIED DESCRIPTION OF PREFERRED EMBODIMENTS OF THE INVENTION

Figure 3A:
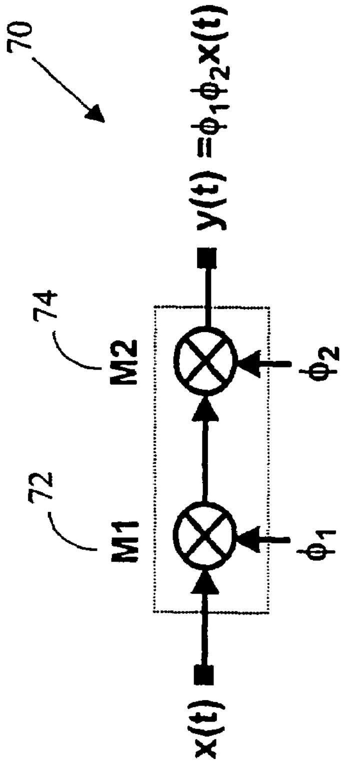
FIG. 3(*a*) presents a block diagram of a broad implementation of the invention.

A device which addresses the objects outlined above, is presented as a block diagram in FIG. 3(*a*). This figure presents a demodulator topography 70 in which an input signal x(t) is mixed with signals which are irregular in the time domain (TD), which effect the desired demodulation. A virtual local oscillator (VLO) is generated by multiplying two functions (labelled $\phi_1$ and $\phi_2$) within the signal path of the input signal x(t) using two mixers M1 72 and M2 74. The mixers described within this invention would have the typical properties of mixers within the art, that is, they would have an associated noise figure, linearity response, and conversion gain. The selection and design of these mixers would follow the standards known in the art, and could be, for example, double balanced mixers. Though this figure implies various elements are implemented in analogue form they can be implemented in digital form.

The two time-varying functions $\phi_1$ and $\phi_2$ that comprise the virtual local oscillator (VLO) signal have the property that their product is equal to the local oscillator (LO) being emulated, however, neither of the two signals has a significant level of power at the frequency of the local oscillator being emulated. As a result, the desired demodulation is affected, but there is no LO signal to leak in the RF path. FIG. 3*b* depicts possible functions for $\phi_1$ and $\phi_2$.

To minimize the leakage of LO power into the RF signal, as in the case of direct conversion receivers, the preferred criteria for selecting the functions $\phi_1$ and $\phi_2$ are:

(i) that $\phi_1$ and $\phi_2$ do not have any significant amount of power at the carrier frequency. That is, the amount of power generated at the carrier frequency should not effect the overall system performance of the receiver in a significant manner;

(ii) the signals required to generate $\phi_1$ and $\phi_2$ should not have a significant amount of power at the RF carrier frequency; and (iii) if x(t) is an RF signal, $\phi_1$ $\phi_1$ $\phi_2$ should not have a significant amount of power within the bandwidth of the RF signal at baseband.

Conditions (i) and (ii) ensure an insignificant amount of power is generated within the system at the carrier frequencies which would cause an equivalent LO leakage problem found in conventional direct conversion topologies. Condition (iii) ensures that if $\phi_1$ leaks into the input port, it does not produce a signal within the baseband signal at the output.

Various functions can satisfy the conditions provided above, several of which are described hereinafter, however it would be clear to one skilled in the art that other similar pairs of signals may also be generated. These signals can in general be random, pseudo-random, periodic functions of time, or digital waveforms. As well, rather than employing two signals as shown above, sets of three or more may be used (additional description of this is given hereinafter).

It would also be clear to one skilled in the art that TD signals may be generated which provide the benefits of the invention to greater or lesser degrees. While it is possible in certain circumstances to have almost no leakage, it may be acceptable in other circumstances to incorporate virtual LO signals which still allow a degree of LO leakage.

It is also important to note that in order to reduce the 1/f noise commonly found in direct conversion receivers, the significant frequency components of $\phi_2$ should be at a lower frequency than the frequency components of the function $\phi_1$.

The topology of the invention is similar to that of direct conversion, but provides a fundamental advantage: minimal leakage of a local oscillator (LO) signal into the RF band. The topology also provides technical advantages over dual conversion topologies such as super-heterodyne systems:

- removes the necessity of having a second LO and various filters; and
- has a higher level of integration as the components it does require are easily placed on an integrated circuit.

While the basic implementation of the invention may produce errors in generating the virtual local oscillator (VLO), solutions to this problem are available and are described hereinafter.

The invention provides the basis for a fully integrated communications receiver. Increasing levels of integration have been the driving impetus towards lower cost, higher volume, higher reliability and lower power consumer electronics since the inception of the integrated circuit. This invention will enable communications receivers to follow the same integration route that other consumer electronic products have benefited from.

Specifically, advantages from the perspective of the manufacturers when incorporating the invention into a product include:

1. significant cost savings due to the decreased parts count of an integral device. Decreasing the parts count reduces the cost of inventory control, reduces the costs associated with warehousing components, and reduces the amount of manpower to deal with higher part counts;
2. significant cost savings due to the decreased manufacturing complexity. Reducing the complexity reduces time to market, cost of equipment to manufacture the product, cost of testing and correcting defects, and reduces time delays due to errors and problems on the assembly line;
3. reduces design costs due to the simplified architecture. The simplified architecture will shorten the first-pass design time and total design cycle time as a simplified design will reduce the number of design iterations required;
4. significant space savings and increased manufacturability due to the high integrability and resulting reduction in product form factor (physical size). This implies huge savings throughout the manufacturing process as smaller device footprints enable manufacturing of products with less material such as printed circuit substrate, smaller product casing and smaller final product packaging;
5. simplification and integrability of the invention will yield products with higher reliability, greater yield, less complexity, higher life span and greater robustness;

6. due to the aforementioned cost savings, the invention will enable the creation of products that would otherwise be economically unfeasible;

Hence, the invention provides the manufacturer with a significant competitive advantage.

From the perspective of the consumer, the marketable advantages of the invention include:

1. lower cost products, due to the lower cost of manufacturing;
2. higher reliability as higher integration levels and lower parts counts imply products will be less prone to damage from shock, vibration and mechanical stress;
3. higher integration levels and lower parts counts imply longer product life span;
4. lower power requirements and therefore lower operating costs;
5. higher integration levels and lower parts counts imply lighter weight products;
6. higher integration levels and lower parts counts imply physically smaller products; and
7. the creation of economical new products.

The present invention relates to the translation of an RF signal directly to baseband and is particular concerned with solving the LO-leakage problem and the 1/f noise problems associated with the present art. The invention allows one to fully integrate a RF receiver on a single chip without using external filters. Furthermore the RF receiver can be used as a multi-standard receiver. Descriptions of such exemplary embodiments follow.

Figure 4:
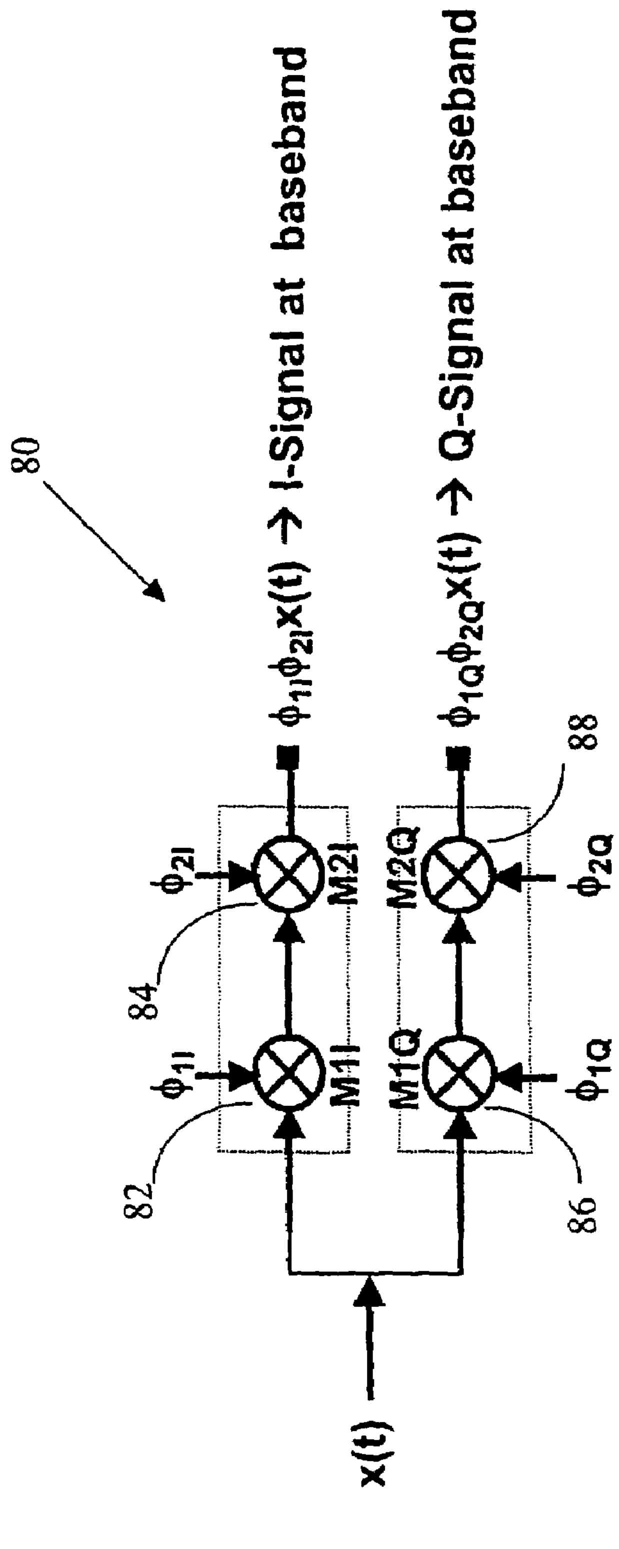
FIG. 4 presents a block diagram of quadrature demodulation in an embodiment of the invention.

In many modulation schemes, it is necessary to demodulate both I and Q components of the input signal, which requires a demodulator 80 as presented in the block diagram of FIG. 4. In this case, four demodulation functions would have to be generated: $\phi_{1I}$ which is 90 degrees out of phase with $\phi_{1Q}$; and $\phi_{2I}$ which is 90 degrees out of phase with $\phi_{2Q}$. The pairing of $\phi_{1I}$ and $\phi_{2I}$ must meet the function selection criteria listed above, as must the pairing of $\phi_{1Q}$ and $\phi_{2Q}$. The mixers 82, 84, 86, 88 are standard mixers as known in the art.

As shown in FIG. 4, mixer M1I 82 receives the input signal x(t) and demodulates it with $\phi_{1I}$; subsequent to this, mixer M2I 84 demodulates signal x(t) $\phi_{1I}$ with $\phi_{2I}$ to yield the in-phase component of the input signal at baseband, that is, x(t) $\phi_{1I}\phi_{2I}$. A complementary process occurs on the quadrature side of the demodulator, where mixer M1Q 86 receives the input signal x(t) and demodulates it with $\phi_{1Q}$; after which mixer M2Q 88 demodulates signal x(t) $\phi_{1Q}$ with $\phi_{2Q}$ to yield the quadrature phase component of the input signal at baseband, that is, x(t) $\phi_{1Q}\phi_{2Q}$. Generation of appropriate $\phi_{1I}$, $\phi_{2I}$, $\phi_{1Q}$ and $\phi_{2Q}$ signals would be clear to one skilled in the art from the teachings herein.

In the analysis above timing errors that would arise when constructing the VLO have been neglected (timing errors can be in the form of a delay or a mismatch in rise/fall times. In the analysis which follows, only delays are considered, but the same analysis can be applied to rise/fall times. The actual VLO that is generated can be written as:

$$VLO_n = VLO_i + \epsilon_{VLO}(t) \tag{1}$$

where $VLO_a$ is the actual VLO generated, $VLO_I$ is the ideal VLO without any timing error, and $\epsilon_{VLO}(t)$ absorbs the error due to timing errors. Therefore, the output signal of the virtual LO topology, denoted as y(t), becomes:

$$y(t) = x(t) \times [VLO_i + \epsilon_{VLO}(t)] \tag{2}$$

The term x(t) VLOi is the wanted term and x(t) $\epsilon_{VLO}(t)$ is a term that produces aliasing power into the wanted signal. The term $\epsilon_{VLO}(t)$ can also be thought of a term that raises the noise floor of the VLO. This term would produce in-band aliasing with power in the order of $\overline{\epsilon VLO}^2$, which is directly related to the bandwidth of the RF signal divided by the unity current gain frequency of the IC technology it is implemented in; assuming the worst-case scenario. This may be a serious problem for some applications. However, by selecting $\phi_1$ and $\phi_2$ carefully and by placing an appropriate filter at the input of the structure, the amount of aliasing power can be reduced significantly, though it can never be completely eliminated due to timing errors.

There are several ways one could further reduce the amount of aliasing power, for example, by using a closed loop configuration as described below. The term x(t) $\epsilon_{VLO}(t)$ contains two terms at baseband:

(i) aliasing power $P_a$, and
(ii) power of the wanted signal, but at a reduced power level which is on the order of delay error $P_{W\epsilon}$.

Therefore, the total power at base-band (denoted by $P_M$) can be decomposed into three components:

(i) the power of the wanted signal, $P_W$,
(ii) the power of the aliasing terms, $P_a$, and
(iii) the power of the wanted signal arising from the term, $P_{W\epsilon}$(this power can either be positive or negative). Therefore, $$P_M = P_W + P_{W\epsilon}(\tau) + P_a(\tau) \tag{3}$$

Note that $P_{W\epsilon}$, and $P_a$ are a function of the delay $\tau$. Since $P_W >> P_{W\epsilon}$, (3) becomes, $$P_M = P_W + P_a(\tau) \tag{4}$$

If the power, $P_M$ is measured and $\tau$ is adjusted in time, one can reduce the term $P_a$ to zero (or close to zero). Mathematically this can be done if the slope of $P_M$ with the delay $\tau$ is set to zero; that is:

$$\frac{dP_M}{d\tau} = \frac{dP_a(\tau)}{d\tau} = 0 \tag{5}$$

Figure 5:
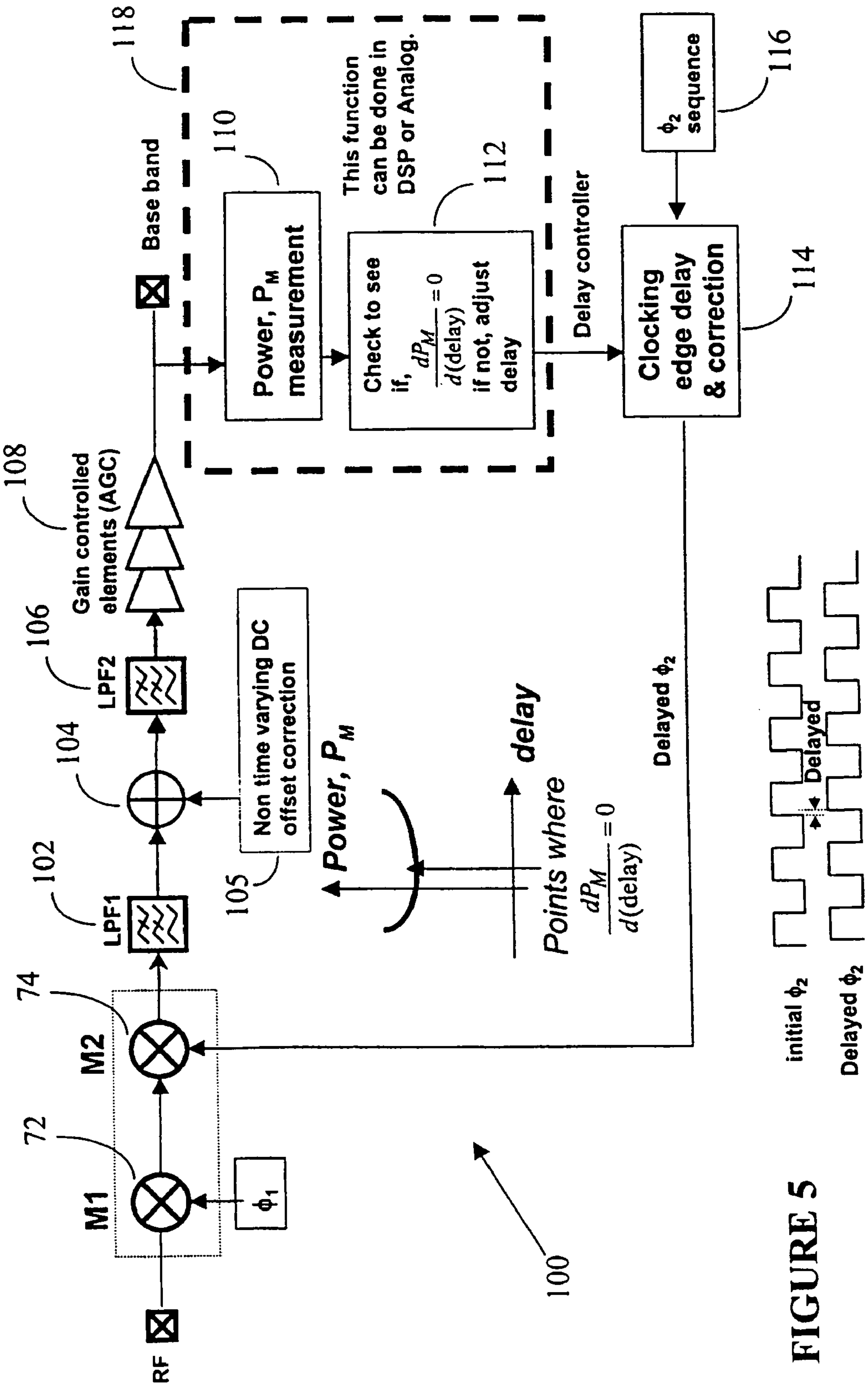
FIG. 5 presents a block diagram of an embodiment of the invention employing error correction by measuring the amount of power at baseband.

A system diagram of this procedure is illustrated in FIG. 5 (a more detailed description is provided in the paragraph below). The power measurement scheme and the element blocks required to detect when $$\frac{dP_M}{d\tau} = 0,$$

can be implemented within a digital signal processing unit (DSP). Also illustrated in FIG. 5 is a visual representation of the power measured versus delay, which identifies an optimum point at which $$\frac{dP_M}{d\tau} = 0.$$

In the block diagram of FIG. 5 the RF signal is first multiplied by the signals $\phi_1$ and $\phi_2$ via mixers M1 72 and M2 74, respectively. The signal is next filtered via a low pass filter (LPF) 102, which is used to reduce the amount of out of band power, which may cause the subsequent elements to compress in gain or distort the wanted signal. The design of this LPF 102, which may also be a band pass filter, depends on the bandwidth of the wanted signal.

Any DC offset is subsequently removed using a technique known in the art, such as a summer 104 and an appropriate DC offset source 105. The signal is then filtered with LPF2 106, which provides further filtering of the base-band signal. The design of this filter depends on the system specifications and system design trade offs. The signal is then amplified using automatic gain control elements (AGC) 108 which provide a significant amount of gain to the filtered baseband signal. The design of AGC 108 depends on the system specifications and system design trade offs.

The physical order (that is, arrangement) of the two LPFs 102, 106, the DC offset correction 104, and the gain control elements 108 can be rearranged to some degree. Such modifications would be clear to one skilled in the art.

The baseband signal power is then measured with power measurement unit 110. The power is minimized with respect to the delay added onto the signal $\phi_2$ by use of the $$\frac{dP_M}{d(\text{delay})} = 0$$

detector 112, and the delay controller 114 which manipulates the $\phi_2$ source 116. In general, the power can be minimized with respect to the rise time of $\phi_2$ or a combination of delay and rise time. Furthermore, the power can be minimized with respect to the delay, rise time, or both delay and rise time of the signal $\phi_1$, or both $\phi_1$ and $\phi_2$.

It would be clear to one skilled in the art that current or voltage may be measured rather than power in certain applications. As well, the phase delay of either or both of $\phi_1$ and $\phi_2$ may be modified to minimized the error.

It is preferred that this power measurement 110 and detection 112 be done within a digital signal processing unit (DSP) 118 after the baseband signal is digitized via an analog to digital converter, but it may be done with separate components, or analogue components.

Figure 6:
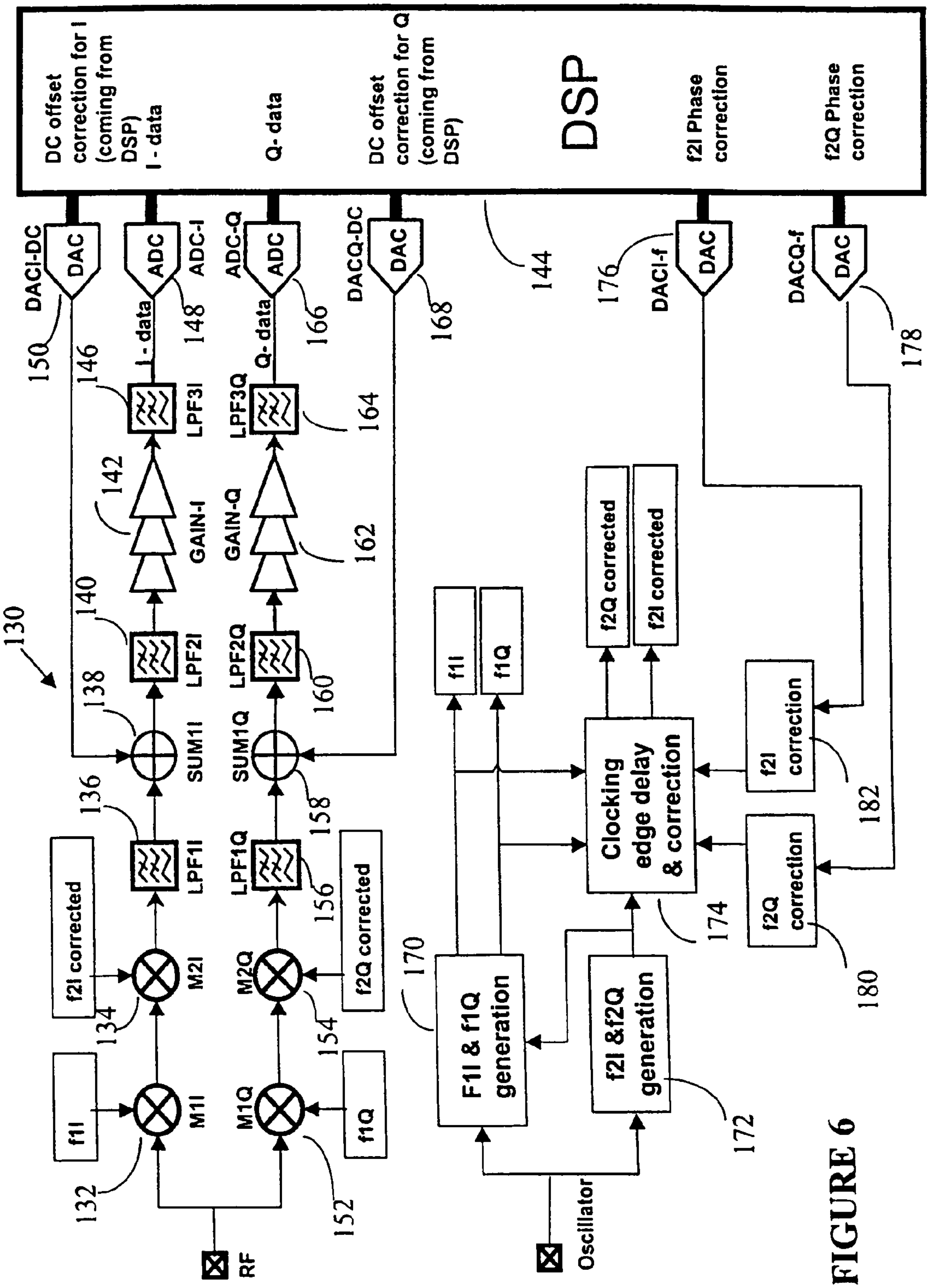
FIG. 6 presents a block diagram of a receiver in a preferred embodiment of the invention.

FIG. 6 presents a complete system block diagram of the preferred embodiment of the timing corrected apparatus of the invention 130, handling in-phase and quadrature components of the input signal. Though the figure implies the use of analogue components, they can be implemented in digital form.

The front end which produces the filtered and amplified baseband signal is the same as that of FIG. 5, except that two channels are used, one for in-phase and one for the quadrature component, as in FIG. 4. Hence, components 132, 134, 136, 138, 140 and 142 of FIG. 6 correspond with components 72, 74, 102, 104, 106 and 108 of FIG. 5 respectively. The input signals to these components are slightly different, as the components of FIG. 6 are required to suit the in-phase component of the input signal. For example, the input to mixer 132 is a suitable in-phase $\phi_1$I signal, such as that input to mixer M1I 82 of FIG. 4, and the input to mixer 134 is a suitable in-phase signal $\phi_2$I similar to that input to mixer M2I 84 of FIG. 4 which has been corrected for delay using the technique of FIG. 5. A description of components for generating these two input signals follows hereinafter.

Two additional differences between the front end of the preferred embodiment of FIG. 6 and other embodiments described herein are:

the generation of the DC offset signal for the summer 138 using the DSP 144 and a digital to analogue convertor (DAC) 150 (compare with the DC offset summer 104 and DC offset source 105 of FIG. 5): and the addition of a third low pass filter LPF3I 146, the de-aliasing filter for the analogue to digital convertor (ADC) 148 that follows. The design of this LPF3I 146 depends on tne system specifications and design.

The design of the front end for the quadrature-phase of the input signal follows in the same manner, with components 152, 154, 156, 158, 160, 162, 164, 166 and 168 complementary to components 132, 134, 136, 138, 140, 142, 146, 148 and 150, respectively. The input signals to these components are also quuadrature-phase complements to the in-phase signal inputs.

It is preferred to generate the inputs to the four mixers 132, 134, 152, 154 in the manner presented in FIG. 6. Specifically, the $\phi_1$I and $\phi_1$Q generation block 170 generates signals $\phi_1$I and $\phi_1$Q, while $\phi_2$I and $\phi_2$Q generation block 172 generates signals $\phi_2$I and $\phi_2$Q. The input to these generation blocks 170, 172 is an oscillator which does not have a significant amount of signal power at the frequency of the RF signal. The construction of the necessary logic for these components would be clear to one skilled in the art from the description herein, and in particular, with reference to FIG. 3. Such signals may be generated using basic logic gates, field programmable gate arrays (FPGA), read only memories (ROMs), micro-controllers or other devices known in the art. Further description and other means of generating such signals is presented in the co-pending patent application under the Patent Cooperation Treaty, Ser. No. PCT/CA00/00996.

Note that the outputs of the $\phi_1$I and $\phi_1$Q generation block 170 go directly to mixers 132 and 152, and also to the clocking edge delay and correction block 174 which corrects the $\phi_2$I and $\phi_2$Q signals. The clocking edge delay and correction block 174 also receives I and Q output control signals from the DSP 144, which are digitized by DAC 176 and 178, and are time corrected at blocks 180 and 182. Correction blocks 180 and 182 modify the digitized signals from DAC 176 and 178 as required to suit the clocking edge delay and correction block 174. There also may be a connection between the $\phi_1$I and $\phi_1$Q generation block 170 and the $\phi_2$I and $\phi_2$Q generation block 172 which may be required where $\phi_1$I and $\phi_1$Q are generated using signals $\phi_2$I and $\phi_2$Q. Of course, this control line may also pass in the opposite direction.

In the exemplary system of FIG. 6, the calculation of the power is done within the DSP unit and a correction signal is generated. The method for correcting the error in the LO signal has been described with respect to FIG. 5.

Figure 3B:
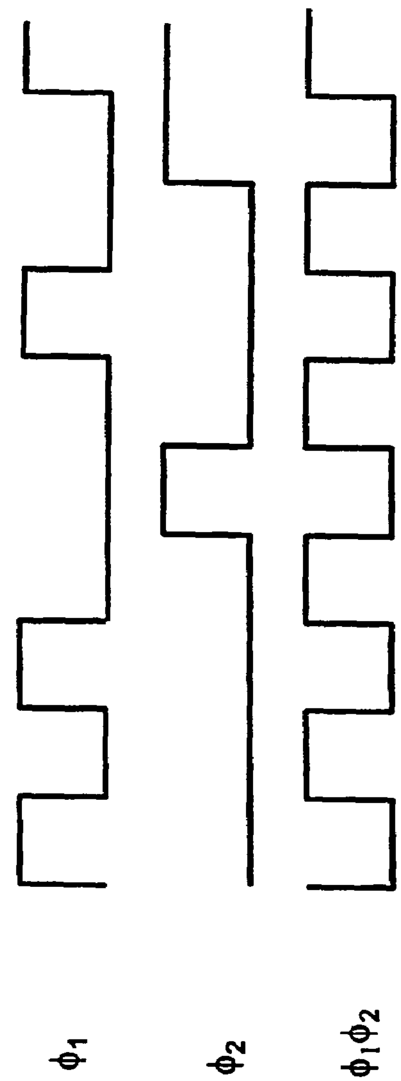
Figure 7:
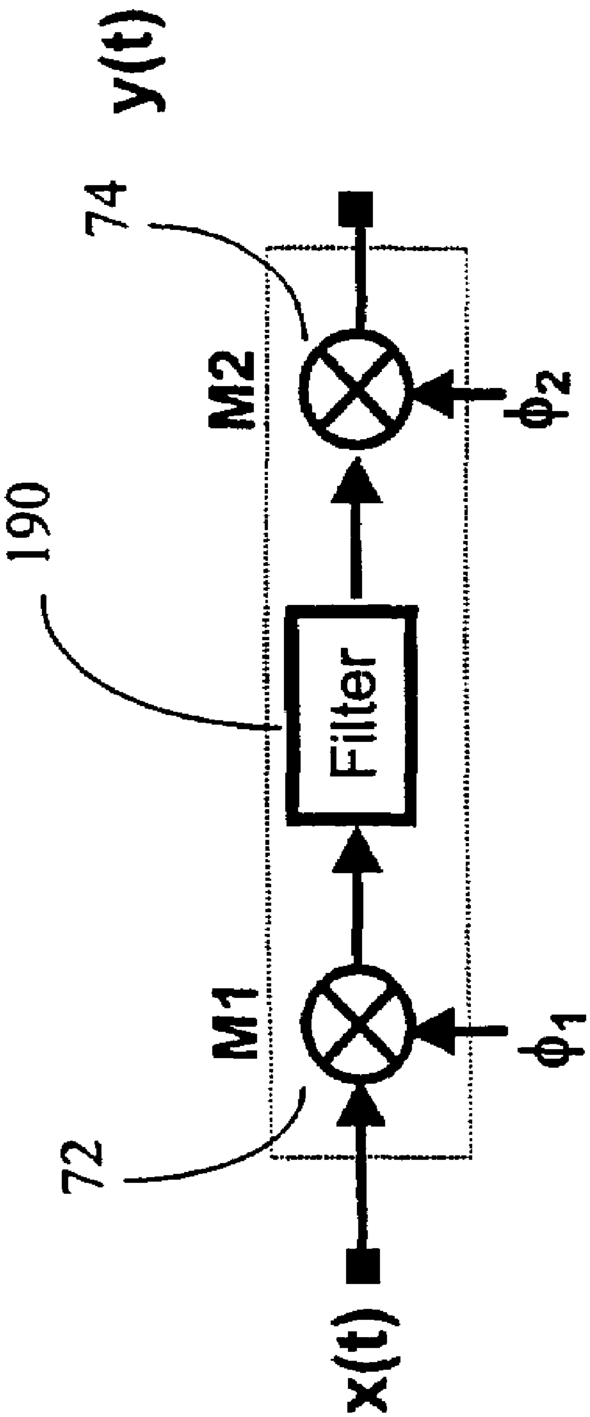
FIG. 7 presents a block diagram of an embodiment of the invention employing a filter placed between mixers M1 and M2.

One variation to the basic structure in FIG. 3*a* is to add a filter 190 between the two mixers 72, 74 as shown in the block diagram of FIG. 7 to remove unwanted signals that are transferred to the output port. This filter 190 may be a low pass, high pass, or band pass filter depending on the receiver requirements. The filter 190 does not necessarily have to be a purely passive filter, that is, it can have active components.

Figure 8:
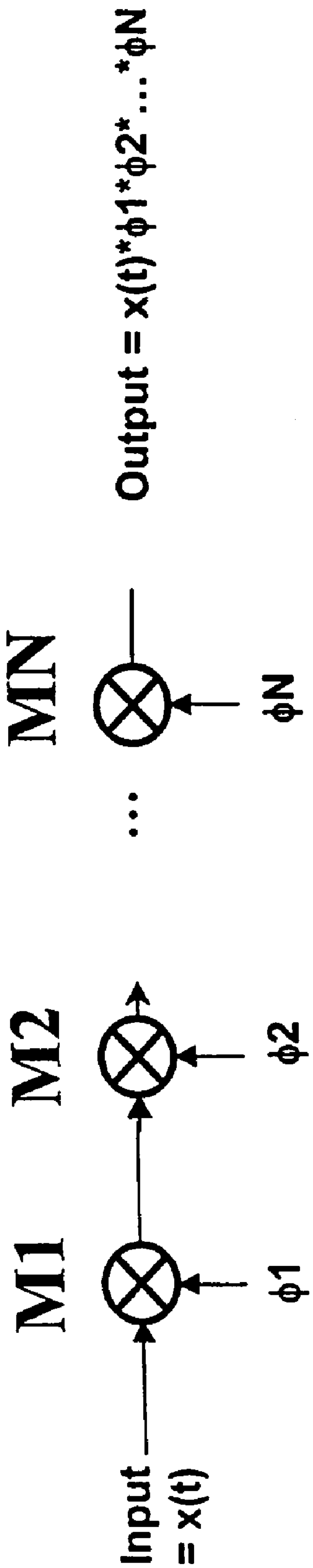
FIG. 8 presents a block diagram of an embodiment of the invention employing N mixers and N mixing signals.

Another variation is that several functions $\phi_1$, $\phi_2$, $\phi_3$ . . . $\phi_n$ may be used to generate the virtual LO, as presented in the block diagram of FIG. 8. Here, $\phi_1{}^* \phi_2{}^* \ldots {}^*\phi_n$ has a significant power level at the LO frequency, but each of the functions $\phi_1 \ldots \phi_n$ contain an insignificant power level at LO.

The electrical circuits of the invention may be described by computer software code in a simulation language, or hardware development language used to fabricate integrated circuits. This computer software code may be stored in a variety of formats on various electronic memory media including computer diskettes, CD-ROM, Random Access Memory (RAM) and Read Only Memory (ROM). As well, electronic signals representing such computer software code may also be transmitted via a communication network.

Clearly, such computer software code may also be integrated with the code of other programs, implemented as a core or subroutine by external program calls, or by other techniques known in the art.

The embodiments of the invention may be implemented on various families of integrated circuit technologies using digital signal processors (DSPs), microcontrollers, microprocessors, field programmable gate arrays (FPGAs), or discrete components. Such implementations would be clear to one skilled in the art.

The invention may be applied to various communication protocols and formats including: amplitude modulation (AM), frequency modulation (FM), frequency shift keying (FSK), phase shift keying (PSK), cellular telephone systems including analogue and digital systems such as code division multiple access (CDMA), time division multiple access (TDMA) and frequency division multiple access (FDMA).

The invention may be applied to such applications as wired communication systems include computer communication systems such as local area networks (LANs), point to point signalling, and wide area networks (WANs) such as the Internet, using electrical or optical fibre cable systems. As well, wireless communication systems may include those for public broadcasting such as AM and FM radio, and UHF and VHF television; or those for private communication such as cellular telephones, personal paging devices, wireless local loops, monitoring of homes by utility companies, cordless telephones including the digital cordless European telecommunication (DECT) standard, mobile radio systems, GSM and AMPS cellular telephones, microwave backbone networks, interconnected appliances under the Bluetooth standard, and satellite communications.

While particular embodiments of the present invention have been shown and described, it is clear that changes and modifications may be made to such embodiments without departing from the true scope and spirit of the invention.

What is claimed is:

1. A radio frequency (RE) down-convertor with reduced local oscillator leakage, for emulating the demodulation of an input signal x(t) with a local oscillator signal having frequency f, said down-convertor comprising:

- a synthesizer for generating mixing signals $\phi_1$ and $\phi_2$ which vary irregularly over time, where;
- $\phi_1 * \phi_2$ has significant power at the frequency f of said local oscillator signal being emulated;
- neither $\phi_1$ nor $\phi_2$ has significant power at the frequency f of said local oscillator signal being emulated; and
- said mixing signals $\phi_1$ and $\phi_2$ are designed to emulate said local oscillator signal having frequency f, in a time domain analysis;
- a first mixer coupled to said synthesizer for mixing said input signal x(t) with said mixing signal $\phi_1$ to generate an output signal x(t) $\phi_1$; and
- a second mixer coupled to said synthesizer and to the output of said first mixer for mixing said signal x(t) $\phi_1$ with said mixing signal $\phi_2$ to generate an output signal x(t) $\phi_1\phi_2$, said output signal x(t) $\phi_1\phi_2$ emulating the modulation of said input signal x(t) with said local oscillator signal having frequency f.

2. The radio frequency (RF) down-convertor of claim 1 wherein said synthesizer is further operable to generate mixing signals $\phi_1$ and $\phi_2$, such that the product $\phi_1 * \phi_1 * \phi_2$ will not result in a significant amount of power within the bandwitdh of an input signal that the down-converter is designed to down-convert to baseband.

3. The radio frequency (RF) down-convertor of claim 2, further comprising:

- a DC offset correction circuit.

4. The radio frequency (RF) down-convertor of claim 3, wherein said DC offset correction circuit comprises:

- a DC source having a DC output; and
- a summer for adding said DC output to an output of one of said mixers.

5. The radio frequency (RF) down-convertor of claim 2, further comprising:

- a closed loop error correction circuit.

6. The radio frequency (RF) down-convertor of claim 5, wherein said closed loop error correction circuit further comprises:

- an error level measurement circuit and
- a time varying signal modification circuit for modifying a parameter of one of said mixing signals $\phi_1$ and $\phi_2$ to minimize said error level.

7. The radio frequency (RF) down-convertor of claim 6, wherein said error level measurement circuit comprises a power measurement.

8. The radio frequency (RF) down-convertor of claim 6, wherein said error level measurement circuit comprises a voltage measurement.

9. The radio frequency (RF) down-convertor of claim 6, wherein said error level measurement circuit comprises a current measurement.

10. The radio frequency (RF) down-convertor of claim 6, wherein said modified parameter is the phase delay of one of said mixing signals $\phi_1$ and $\phi_2$.

11. The radio frequency (RF) down-convertor of claim 6, wherein said modified parameter is the fall or rise time of one of said mixing signals $\phi_1$ and $\phi_2$.

12. The radio frequency (RF) down-convertor of claim 6, wherein said modified parameter includes both the phase delay and the fall or rise time of one of said mixing signals $\phi_1$ and $\phi_2$.

13. The radio frequency (RF) down-convertor of claim 2 wherein said synthesizer further comprises:

- a synthesizer for generating mixing signals $\phi_1$ and $\phi_2$, where said mixing signals $\phi_1$ and $\phi_2$ can change with time in order to reduce errors.

14. The radio frequency (RF) down-convertor of claim 1, further comprising:

- a filter for removing unwanted signal components from said x(t) $\phi_1$ signal.

15. The radio frequency (RF) down-convertor of claim 1, wherein said mixing signal $\phi_2$ is a square wave.

16. The radio frequency (RF) down-convertor of claim 1, wherein said mixing signals $\phi_1$ and $\phi_2$ effect the modulation of an in-phase component of said input signal x(t), and a complementary down-convertor with mixing signals 90 degrees out of phase, is used to effect the modulation of a quadrature component of said input signal x(t).

17. The radio frequency (RF) down-convertor of claim 1, wherein said mixing signals $\phi_1$ and $\phi_2$ are irregular.

18. The radio frequency (RF) down-convertor of claim 1, wherein said signals $\phi_1$ and $\phi_2$ are digital waveforms.

19. The radio frequency (RF) down-convertor of claim 1, wherein said mixing signals $\phi_1$ and $\phi_2$ are square waveforms.

20. The radio frequency (RF) down-convertor of claim 1, further comprising:

a local oscillator coupled to said synthesizer for providing a signal having a frequency that is an integral multiple of the desired mixing frequency.

21. An integrated circuit comprising the radio frequency (RF) down-convertor of claim 1.

22. The radio frequency (RF) down-convertor of claim 1, where said synthesizer uses different patterns to generate signals $\phi_1$ and $\phi_2$.

23. The radio frequency (RF) down-convertor of claim 1, wherein said synthesizer uses a single time base to generate both mixing signals $\phi_1$ and $\phi_2$.

24. A method of demodulating a radio frequency (RF) signal x(t) with reduced local oscillator leakage comprising the steps of:

generating mixing signals $\phi_1$ and $\phi_2$ which vary irregularly over time, where;

$\phi_1 * \phi_2$ has significant power at the frequency f of a local oscillator signal being emulated, neither $\phi_1$ nor $\phi_2$ has significant power at the frequency of said local oscillator signal being emulated; and said mixing signals $\phi_1$ and $\phi_2$ are designed to emulate said local oscillator signal having frequency f, in a time domain analysis;

mixing said input signal x(t) with said mixing signal $\phi_1$ to generate an output signal x(t) $\phi_1$; and mixing said signal x(t) $\phi_1$ with said mixing signal $\phi_2$ to generate an output signal x(t) $\phi_1\phi_2$.

* * * * *